(12) United States Patent
Kajigaya

(10) Patent No.: US 7,715,269 B2
(45) Date of Patent: May 11, 2010

(54) SEMICONDUCTOR MEMORY DEVICE AND SEMICONDUCTOR DEVICE COMPRISING THE SAME

(75) Inventor: Kazuhiko Kajigaya, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 273 days.

(21) Appl. No.: 11/892,229

(22) Filed: Aug. 21, 2007

(65) Prior Publication Data

US 2008/0049536 A1     Feb. 28, 2008

(30) Foreign Application Priority Data

Aug. 22, 2006    (JP)   ............... 2006-225773

(51) Int. Cl.
*G11C 8/00*    (2006.01)
(52) U.S. Cl. ............... 365/230.05; 365/230.03; 365/230.02; 365/189.011
(58) Field of Classification Search ............ 365/230.05, 365/230.02, 230.03, 189.011
See application file for complete search history.

(56) References Cited

U.S. PATENT DOCUMENTS

| 2005/0204100 A1* | 9/2005 | Fukuzo ................... 711/149 |
| 2005/0204101 A1 | 9/2005 | Fukuzo |

FOREIGN PATENT DOCUMENTS

| JP | 1-266651 | 10/1989 |
| JP | 3-214250 | 9/1991 |
| JP | 2005-259320 | 9/2005 |

* cited by examiner

*Primary Examiner*—Pho M Luu
*Assistant Examiner*—Tha-O Bui
(74) *Attorney, Agent, or Firm*—McGinn IP Law Group, PLLC

(57) ABSTRACT

A semiconductor memory device includes a plurality of input/output (I/O) ports, a plurality of memory cell arrays and a region configurator. The region configurator is adapted to hold share region information about at least one share region. In the memory cell arrays, at least one share region accessible through the I/O ports is configured on the basis of the share region information.

12 Claims, 9 Drawing Sheets

SEMICONDUCTOR MEMORY DEVICE AND SEMICONDUCTOR DEVICE COMPRISING THE SAME

BACKGROUND OF THE INVENTION

This invention relates to a semiconductor memory device such as a multi-port memory device comprising multiple input/output (I/O) ports and to a semiconductor device comprising the semiconductor memory device.

Multi-port memory devices such as dual-port memory devices are used in an electronic apparatus such as a mobile terminal or a cellular phone. The electronic apparatus comprises a plurality of processors, e.g. a central processing unit (CPU) for control of the whole apparatus and a digital signal processor (DSP) for sound processing. The multi-port memory device comprises multiple I/O ports which are assigned to and are accessible by the processors, respectively.

One of multi-port memory devices is disclosed in US 2005/204101 A1 or US 2005/204100 A1, the contents of which are incorporated herein by reference. The disclosed device comprises at least one share region, which is accessible through multiple I/O ports from multiple processors. However, the size of the share region is fixed during the manufacturing process of the device.

SUMMARY OF THE INVENTION

It is an object of the present invention to provide a semiconductor memory device that comprises at least one reconfigurable share region accessible through multiple I/O ports.

According to one aspect of the present invention, a semiconductor memory device comprises a plurality of I/O ports, a plurality of memory cell arrays and a region configurator. The region configurator is adapted to hold share region information about at least one share region. In the memory cell arrays, at least one share region accessible through the I/O ports is configured on the basis of the share region information.

An appreciation of the objectives of the present invention and a more complete understanding of its structure may be had by studying the following description of the preferred embodiment and by referring to the accompanying drawings.

Figure 1:
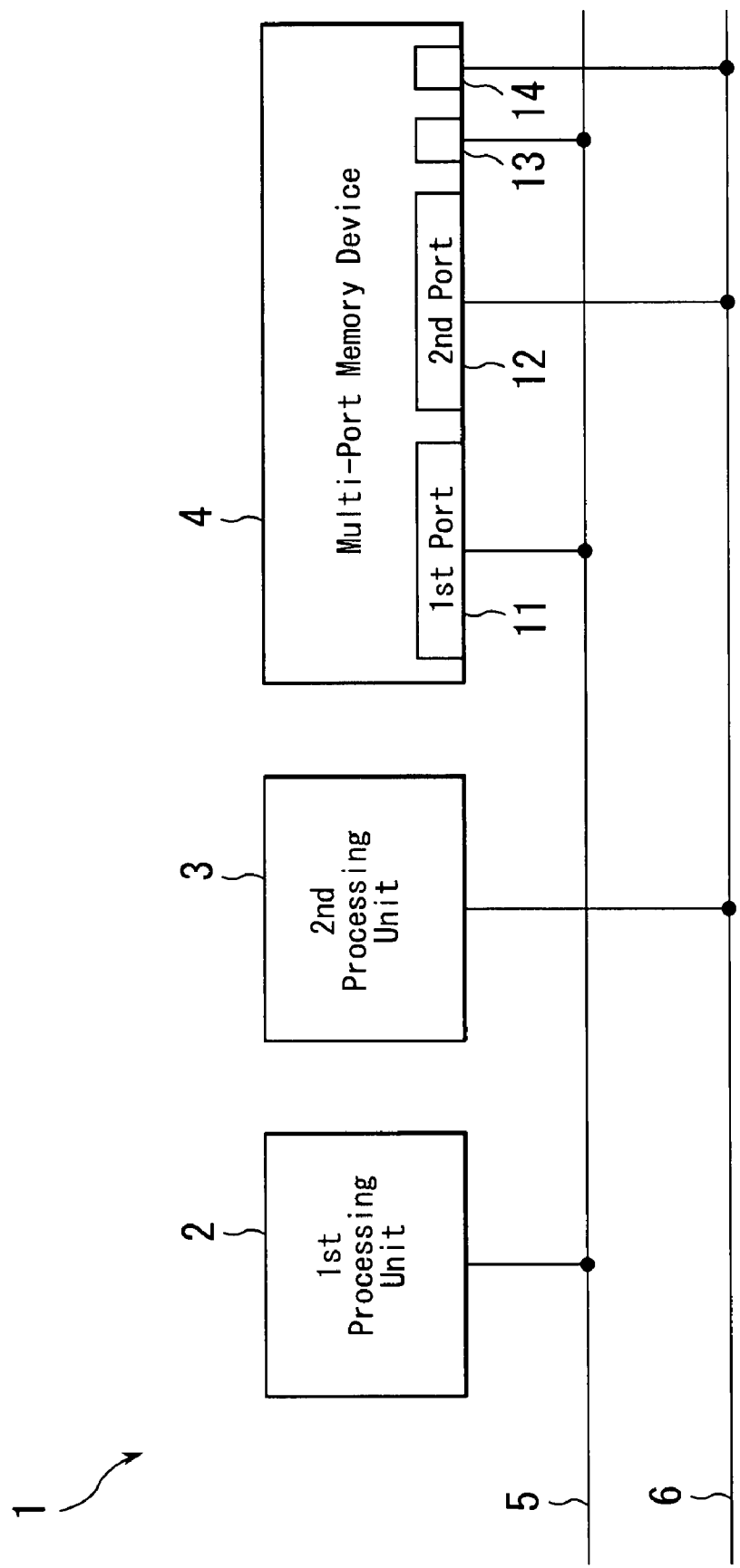
FIG. 1 is a block diagram schematically showing a computer system according to an embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

With reference to FIG. 1, a computer system 1 according to an embodiment of the present invention comprises first and second processing units 2, 3, a multi-port memory device 4 and first and second external buses 5, 6. For example, each of the first and second processing units 2, 3 is a CPU, a DSP or the like. In detail, each of the illustrated first and second processing units 2, 3 comprises an individual processor core which constitutes a multi-core processor. The first processing unit 2 is coupled to the first external bus 5, while the second processing unit 3 is coupled to the second external bus 6. Although the computer system 1 further comprises various well known devices or sections in addition to the above-mentioned units and devices, such various known devices are not shown in FIG. 1 for the sake of clarity.

Figure 2:
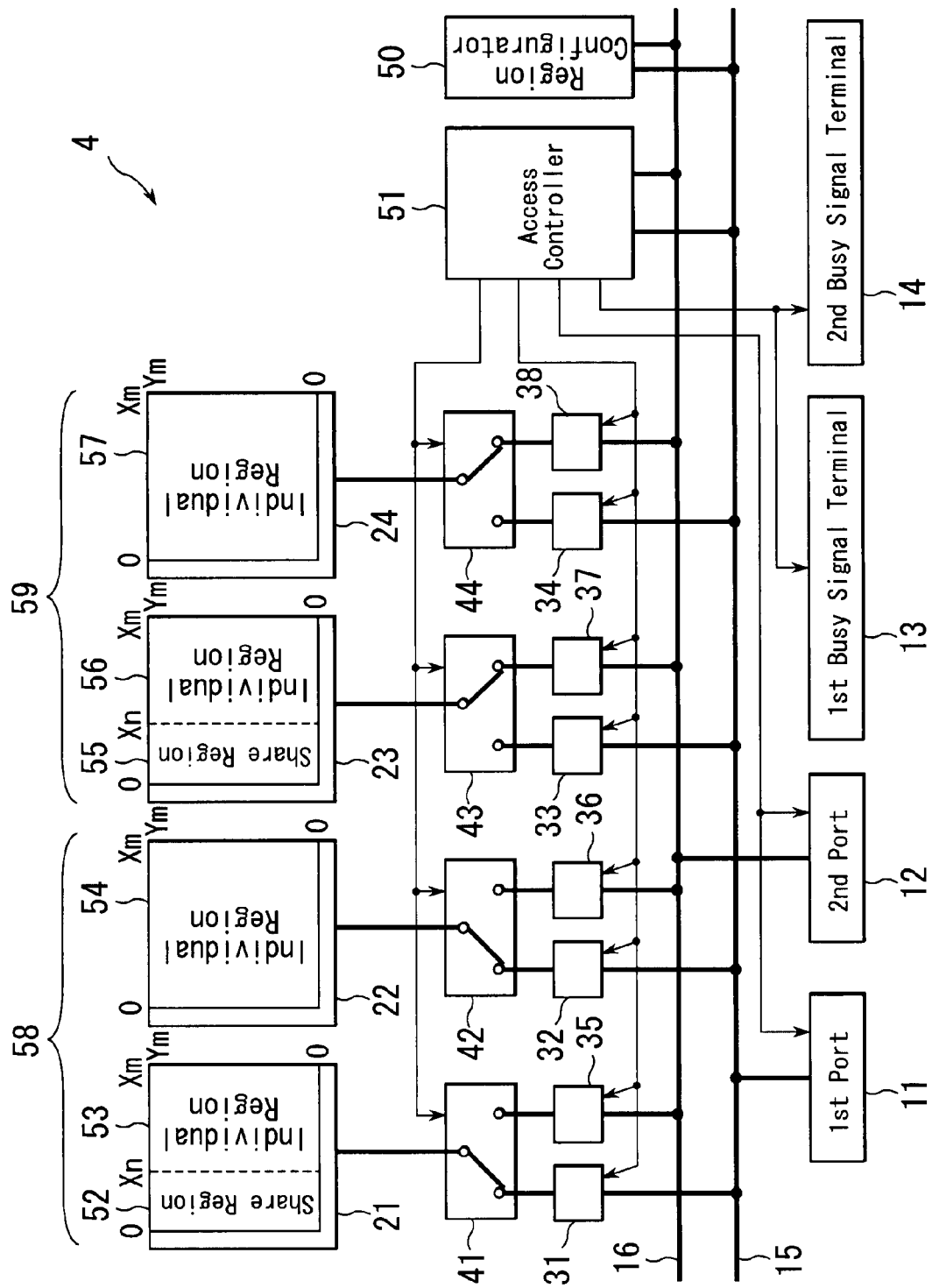
FIG. 2 is a diagram schematically showing a multi-port memory device included in the computer system of FIG. 1.

With reference to FIG. 2, the multi-port memory device 4 comprises first and second ports 11, 12, first and second busy-signal terminals 13, 14, first and second buses 15, 16, first to fourth memory cell arrays 21 to 24, first to eighth control circuits 31 to 38, first to fourth selectors 41 to 44, a region configurator 50, and an access controller 51.

As shown in FIG. 1, the first port 11 and the first busy-signal terminal 13 of the multi-port memory device 4 are coupled to the first external bus 5, while the second port 12 and the second busy-signal terminal 14 are coupled to the second external bus 6.

As shown in FIG. 2, the first and the second ports 11, 12 are coupled to the first and the second buses 15, 16, respectively. The first port 11 receives various signals, e.g. command signals, address signals and write data signals, through the first external bus 5 and transmits them into the first bus 15. On the other hand, the first port 11 receives various signals, e.g. read data signals, through the first bus 15 and transmits them into the first external bus 5. When receiving a forbiddance signal, the first port 11 forbids signal transmission between the first external bus 5 and the first bus 15 unless the forbiddance signal is cleared. Likewise, the second port 12 receives various signals through the second external bus 6 and transmits them into the second bus 16; on the other hand, the second port 12 receives various signals through the second bus 16 and transmits them into the second external bus 6. When receiving a forbiddance signal, the second port 12 forbids signal transmission between the second external bus 6 and the second bus 16 unless the forbiddance signal is cleared.

Commands input through the first and the second external buses 5, 6 include read commands and write commands. Addresses input through the first and the second external buses 5, 6 include bank addresses Bin, column addresses Yin and row addresses Xin.

Each of the first and second buses 15, 16 is a set of signal lines which are signal lines for transmitting signals input through the first or the second port 11, 12 and other signal lines for transmitting other signals produced in the multi-port memory device 4.

Each of the first to the fourth memory cell arrays 21 to 24 comprises a plurality of memory cells, which are arranged in a matrix form and are addressed by the use of column addresses and row addresses for write/read operations. In this embodiment, row addresses are represented as 0 to Xm, while column addresses are represented as 0 to Ym.

The first to the fourth control circuits 31 to 34 are coupled to the first bus 15 and access the first to the fourth memory cell arrays 21 to 24, respectively, on the basis of bank addresses, row addresses and column addresses input through the first port 11. In detail, during a read operation, each of the first to the fourth control circuits 31 to 34 reads data out of the accessed memory cell; during a write operation, each of the first to the fourth control circuits 31 to 34 writes date into the accessed memory cell.

Into the first to the fourth control circuits 31 to 34, bank addresses of the first to the fourth memory cell arrays are respectively set. In the present embodiment, the first to the fourth memory cell arrays 21 to 24 are assigned "bank 0", "bank 1", "bank 0" and "bank 1", respectively. When a bank address Bin of "bank 0" is input through the first bus 15, the first and the third control circuits 31, 33 access the first and the third memory cell arrays 21, 23, respectively. When a bank address Bin of "bank 1" is input through the first bus 15, the second and the fourth control circuits 32, 34 access the second and the fourth memory cell arrays 22, 24, respectively. In this embodiment, the first to the fourth control circuits 31 to 34 are designed to be able to access the first to the fourth memory cell arrays 21 to 24, respectively, with adjustable access timing.

The fifth to the eighth control circuits 35 to 38 are coupled to the second bus 16 and access the first to the fourth memory cell arrays 21 to 24, respectively, on the basis of bank addresses, row addresses and column addresses input through the second port 12. In detail, during a read operation, each of the fifth to the eighth control circuits 35 to 38 reads data out of the accessed memory cell; during a write operation, each of the fifth to the eighth control circuits 35 to 38 writes date into the accessed memory cell.

Into the fifth to the eighth control circuits 35 to 38, bank addresses of the first to the fourth memory cell arrays are respectively set. When a bank address Bin of "bank 0" is input through the second bus 16, the fifth and the seventh control circuits 35, 37 access the first and the third memory cell arrays 21, 23, respectively. When a bank address Bin of "bank 1" is input through the second bus 16, the sixth and the eighth control circuits 36, 38 access the second and the fourth memory cell arrays 22, 24, respectively. In this embodiment, the fifth to the eight control circuits 35 to 38 are designed to be able to access the first to the fourth memory cell arrays 21 to 24, respectively, with adjustable access timing.

The first to the fourth selectors 41 to 44 select one between an access through the first port 11 and another access through the second port 12. In this embodiment, the first to the fourth selectors 41 to 44 connect the first to the fourth memory cell arrays 21 to 24 with the first to the fourth control circuits 31 to 34, respectively, in order to enable access from the first port 11 to the first to the fourth memory cell arrays 21 to 24, respectively. In addition, the first to the fourth selectors 41 to 44 connect the first to the fourth memory cell arrays 21 to 24 with the fifth to the eighth control circuits 35 to 38, respectively, in order to enable access from the second port 12 to the first to the fourth memory cell arrays 21 to 24, respectively.

The region configurator 50 stores association information or memory assignment information and share region information. The region configurator 50 is coupled to the first bus 15 and to the second bus 16. Therefore, the region configurator 50 is rewritable from the outside of the multi-port memory device 4 so that the association information or the memory assignment information and the share region information are reconfigurable in this embodiment.

The association information or the memory assignment information indicates a memory group of each of the first to the fourth memory cell arrays 21 to 24. In accordance with the association information of the present embodiment, the first to the fourth memory cell arrays 21 to 24 are grouped into first and second memory groups. In other words, each of the first to the fourth memory cell arrays 21 to 24 is belongs to any one of the first and the second memory groups.

The first memory group corresponds to the first port 11, while the second memory group corresponds to the second port 12. The memory cell arrays belonging to the first memory normally perform in accordance with signals input through the first port 11. The memory cell arrays belonging to the second memory normally perform in accordance with signals input through the second port 12. Under an initial state of the multi-port memory device 4, the first processing unit 2 accesses the first memory group through the first port 11, while the second processing unit 3 accesses the second memory group through the second port 12.

As illustrated in FIG. 2, the first memory group 58 comprises the first and the second memory cell arrays 21, 22, while the second memory group 59 comprises the third and the fourth memory cell arrays 23, 24. In other words, the association information of the present embodiment indicates the above-mentioned association of the first to the fourth memory cell arrays 21 to 24 with the first and the second memory groups. Although the first and the second memory groups comprises memory cell arrays of the same number in this embodiment, the first and the second memory groups may comprise different numbers of memory cell arrays from each other. Furthermore, the association information may be set so that all of the memory cell arrays 21 to 24 belongs to any one of the first and the second memory groups 58, 59.

The share region information indicates at least one region in the first to the fourth memory cell arrays 21 to 24 as a share region accessible through the first and the second ports 11, 12. In this embodiment, a share region is provided for each of the first and the second memory groups 58, 59. In other words, the multi-port memory device 4 of the present embodiment comprises multiple share regions, and each of the first and the second memory groups 58, 59 has its own share region.

In addition, the share region information of the present embodiment indicates a boundary between a share region and an individual region in the first to the fourth memory cell arrays 21 to 24, wherein the individual region is different from the share region and is accessible only through a corresponding one of the first and the second ports 11, 12.

In detail, the illustrated individual regions 53, 54 of the first memory group 58 are accessible only by the first processing unit 2 through the first port 11, while the illustrated individual regions 56, 57 of the second memory group 59 are accessible only by the second processing unit 3 through the second port 12.

The share region 52 of the first memory group 58 and the share region 55 of the second memory group 59 have the same address space as each other and store the same data in the same addresses. In the case where the first processing unit 2 writes data into the share region 52, the data is also written into the share region 55. In the case where the second processing unit 3 writes data into the share region 55, the data is also written into the share region 52. In this embodiment, the write operation to the share region 52 and the write operation to the share region 55 are carried out simultaneously, as described later. In addition, data of the share region 52 is read out thereof only by the first processing unit 2, while data of the share region 55 is read out thereof only by the second processing unit 3.

In this embodiment, the share region information has a specific row address Xn as the boundary between a share region and an individual region in a memory cell array. The boundary is adjustable by a row address. A share region is configured into each of the first and the second memory groups 58, 59 in accordance with the share region information so that each share region is constituted by memory cells from the lowest row address of the lowest bank to the specific row address Xn of each of the first memory group 58 and the second memory group 59.

In detail, the share region 52 of the first memory group 58 is constituted by memory cells from the row address 0 to the specific row address Xn of the first memory cell array 21 that is assigned "bank 0"; the remaining memory cells from the row address Xn+1 to the highest row address Xm of the first memory cell array 21 constitute the individual region 53, and all memory cells of the second memory cell array 22 constitute the individual region 54. Likewise, the share region 55 of the second memory group 59 is constituted by memory cells from the row address 0 to the specific row address Xn of the third memory cell array 23 that is assigned "bank 0"; the remaining memory cells from the row address Xn+1 to the highest row address Xm of the third memory cell array 23 constitute the individual region 56, and all memory cells of the fourth memory cell array 24 constitute the individual region 57.

The share region information may have a specific bank address in addition to the specific row address Xn. For example, if the specific bank address is "bank 1", a share region of the first memory group 58 is constituted by all memory cells of the first memory cell array 21 (bank 0) and memory cells from the lowest row address 0 to the specific row address Xn of the second memory cell array 22 (bank 1). Likewise, another share region of the second memory group 59 is constituted by all memory cells of the third memory cell array 23 (bank 0) and memory cells from the lowest row address 0 to the specific row address Xn of the fourth memory cell array 24 (bank 1). The share region information may have other information instead of the specific row address Xn, provided that a share region and an individual region can be distinguished from each other.

The access controller 51 sets bank addresses to the memory cell arrays each of the first and the second memory groups 58, 59 in accordance with the association information stored in the region configurator 50.

In this embodiment, the access controller 51 sets "bank 0" to the first and the fifth control circuits 31, 35 both relating to the first memory cell array 21. The access controller 51 sets "bank 1" to the second and the sixth control circuits 32, 36 both relating to the second memory cell array 22. The access controller 51 also sets "bank 0" to the third and the seventh control circuits 33, 37 both relating to the third memory cell array 23. The access controller 51 also sets "bank 1" to the fourth and the eighth control circuits 34, 38 both relating to the fourth memory cell array 24.

The access controller 51 controls the first and the second selectors 41, 42 on the basis of the association information of the region configurator 50 at the initial state so that the first and the second memory cell arrays 21, 22 are accessible through the first port 11. Also, the access controller 51 controls the third and the fourth selectors 43, 44 on the basis of the association information at the initial state so that the third and the fourth memory cell arrays 23, 24 are accessible through the second port 12.

Figure 3:
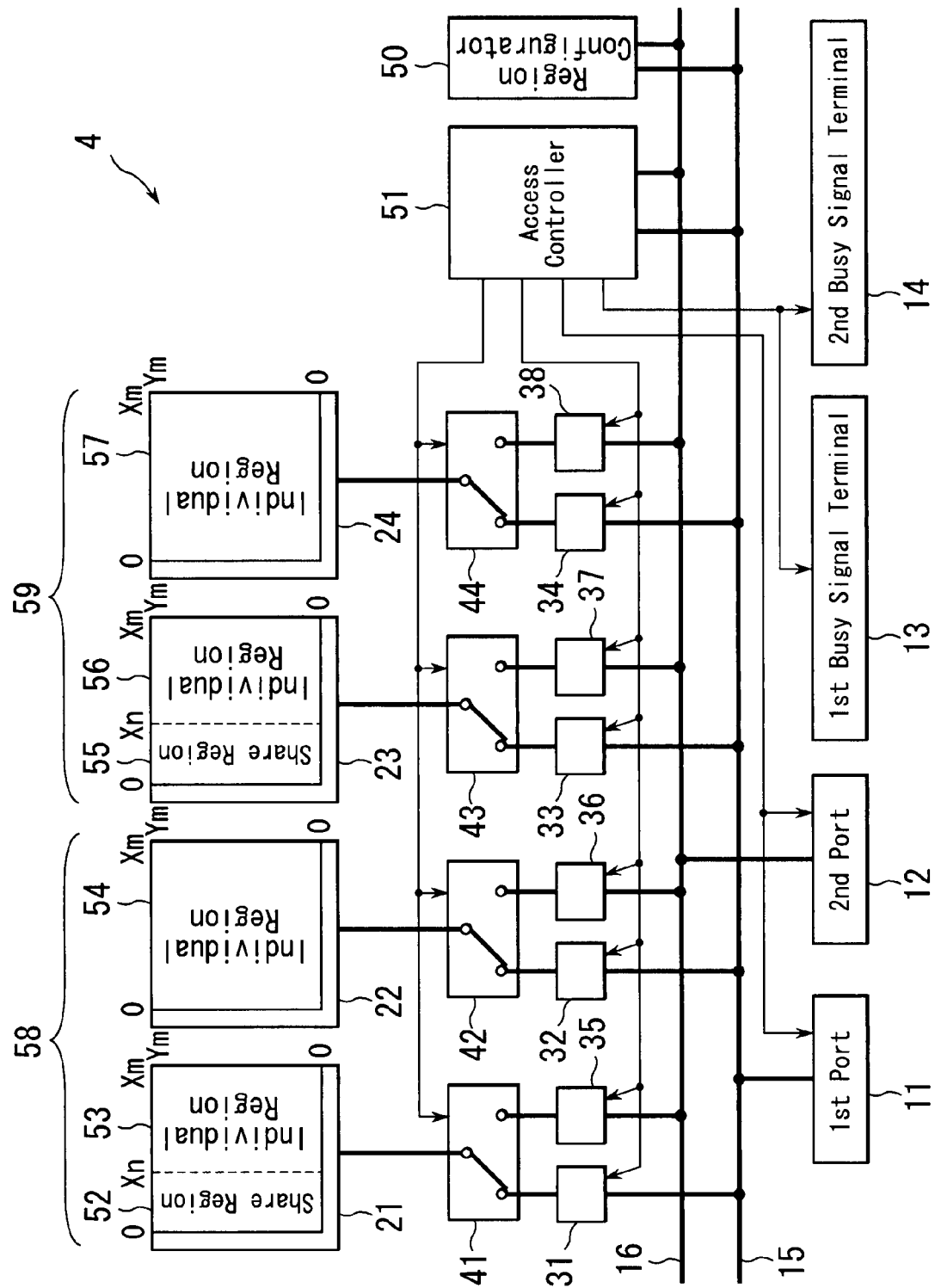
FIG. 3 is a diagram schematically showing the multi-port memory device of FIG. 2, wherein the illustrated device has a different state from that of FIG. 2.

While the first processing unit 2 is willing to write data into the share region 52 of the first memory group 58, the access controller 51 controls the first to the fourth selectors 41 to 44 so that all of the memory cell arrays 21 to 24 are accessible only by the first processing unit 2, as shown in FIG. 3. Likewise, while the second processing unit 3 is willing to write data into the share region 55 of the second memory group 59, the access controller 51 controls the first to the fourth selectors 41 to 44 so that all of the memory cell arrays 21 to 24 are accessible only by the second processing unit 2.

More in detail, the access controller 51 controls the first to the fourth selectors 41 to 44 to connect the first to the fourth memory cell arrays 21 to 24 with the first to the fourth control circuits 31 to 34, respectively, if a bank address Bin is "bank 0" and a row address Xin is not larger than the specific row address Xn of the share region information when a write command is provided through the first port 11. On the other hand, the access controller 51 controls the first to the fourth selectors 41 to 44 to connect the first to the fourth memory cell arrays 21 to 24 with the fifth to the eighth control circuits 35 to 38, respectively, if a bank address Bin is "bank 0" and a row address Xin is not larger than the specific row address Xn of the share region information when a write command is provided through the second port 12. After the write operation to the share regions 52, 55, the access controller 51 controls the first to the fourth selectors 41 to 44 back into the initial state.

When the first processing unit 2 is willing to write data into the share regions 52, 55 while the second processing unit 3 accesses the third and the fourth memory cell arrays 23, 24 of the second memory group 59, the access controller 51 forces the first processing unit 2 to postpone an access to the share regions 52, 55 until the access by the second processing unit 3 is finished. After the access by the second processing unit 3, the access controller 51 issues the forbiddance signal for the second port 12 to forbid an access to the second memory group 59 by the second processing unit 3, while issuing a busy signal for the second processing unit 3 through the second busy-signal terminal 14 to notify the second processing unit 3 that the second memory group 59 cannot be accessed. After the write operation to the share regions 52, 55 by the first processing unit 2, the access controller 51 clears the forbiddance signal issued for the second port 12 and also clears the busy signal issued for the second processing unit 3.

When the second processing unit 3 is willing to write data into the share regions 52, 55 while the first processing unit 2 accesses the first and the second memory cell arrays 21, 22 of the first memory group 58, the access controller 51 forces the second processing unit 3 to postpone an access to the share regions 52, 55 until the access by the first processing unit 2 is finished. After the access by the first processing unit 2, the access controller 51 issues the forbiddance signal for the first port 11 to forbid an access to the first memory group 58 by the first processing unit 2, while issuing a busy signal for the first processing unit 2 through the first busy-signal terminal 13 to notify the first processing unit 2 that the first memory group 58 cannot be accessed. After the write operation to the share regions 52, 55 by the second processing unit 3, the access controller 51 clears the forbiddance signal issued for the first port 11 and also clears the busy signal issued for the first processing unit 2.

The access controller 51 of the present embodiment further has an arbitration function. When a write operation to the share regions 52, 55 by the first processing unit 2 conflicts with another write operation to the share regions 52, 55 by the second processing unit 3, the access controller 51 arbitrates the write operations to enable only one of the write operations at a time.

When the first processing unit 2 is willing to write data into the share regions 52, 55 while the second processing unit 3 accesses the second memory group 59 through the second port 12, the access controller 51 may allow a write operation to the share region 52, while postponing a write operation to the share region 55 so that the write operation to the share region 55 is carried out after the access to the second memory group 59 by the second processing unit 3.

Next explanation will be made about a total operation of the computer system 1 of the above-mentioned embodiment. Because a read/write operation by the first processing unit 2 is similar to another read/write operation by the second processing unit 3, only the read/write operation by the first processing unit 2 is explained hereinafter.

[Read Operation]

Under the initial state, the first to the fourth selectors 41 to 44 connects the first to the fourth memory cell arrays 21 to 24 with the first, the second, the seventh and the eighth control circuits 31, 32, 37, 38, respectively, as shown in FIG. 2.

When the first processing unit 2 issues a read command for the first memory group 58, the access controller 51 keeps the first to the fourth selectors 41 to 44 at the initial state. When a bank address Bin is "bank 0", the first control circuit 31 reads data out of the first memory cell array 21 in accordance with a row address Xin and a column address Yin and sends out the read data into the first bus 15. On the other hand, when a bank address Bin is "bank 1", the second control circuit 32 reads data out of the second memory cell array 22 in accordance with a row address Xin and a column address Yin and sends out the read data into the first bus 15. The read data sent into the first bus 15 is transmitted into the first processing unit 2 through the first port 11 and the first external bus 5.

Because the first bus 15 is not connected to the second memory group 59 during the read operation by the first processing unit 2, the second processing unit 3 can read data out of the second memory group 59 or can write data into the individual regions 56, 57 while the first processing unit 2 accesses the first memory group 58.

[Write Operation to Individual Region]

Even if the first processing unit 2 issues a write command for the first memory group 58, the access controller 51 keeps the first to the fourth selectors 41 to 44 at the initial state if a bank address Bin is "bank 0" and a row address is larger than the specific row address Xn or if a bank address Bin is "bank 1". In this event, the first control circuit 31 writes data into the individual region 53 of the first memory cell array 21 if the bank address Xin is "bank 0". On the other hand, the second control circuit 32 writes data into the individual region 54 of the second memory cell array 22 if the bank address Xin is "bank 1".

Because the first bus 15 is not connected to the second memory group 59 during the write operation to the individual regions 53, 54 by the first processing unit 2, the second processing unit 3 can read data out of the second memory group 59 or can write data into the individual regions 56, 57 while the first processing unit 2 carries out the write operation to the individual regions 53, 54.

[Write Operation to Share Region]

If the first processing unit 2 issues a write command for the share region 52 of the first memory group 58, i.e. if the write command is for a bank address Bin equal to "bank 0" and a row address Xin not larger than the specific row address Xn, the access controller 51 controls the first to the fourth selectors 41 to 44 in a state shown in FIG. 3. If the write command is issued while the second processing unit 3 accesses the second memory group 59, the access controller 51 controls the first to the fourth selectors 41 to 44 in the state of FIG. 3 after the access by the second processing unit 3. In detail, the access controller 51 controls the first to the fourth selectors 41 to 44 to connect the first to the fourth memory cell arrays 21 to 24 with the first to the fourth control circuits 31 to 34, respectively, and issues a forbiddance signal for the second port 12 to forbid an access through the second port 12. Furthermore, the access controller 51 issues a busy signal for the second processing unit 3 through the second busy-signal terminal 14 to notify the second processing unit 3 of the busy state of the multi-port memory device 4.

Because the input bank address Bin is "bank 0", the first and the third control circuits 31, 33 write data into the share region 52 of the first memory cell array 21 and the share region 55 of the third memory cell array 23, respectively. The data written into the share region 52 is same as the data written into the share region 55. The addresses of the written data in the share region 52 are also same as the addresses of the written data in the share region 55. After the write operation to the share regions 52, 55, the access controller 51 controls the first to the fourth selectors 41 to 44 into their initial states. In addition, the access controller 51 clears the forbiddance signal for the second port 12 and also clears the busy signal through the second busy-signal terminal 14.

As explained above, the computer system 1 of the present embodiment comprises two processing units 2, 3. However, the present invention is not limited thereto. The computer system may comprise three or more processing units as well as three or more external buses. Also, the multi-port memory device 4 may comprise three or more ports and have three or more controllable memory groups.

Figure 4:
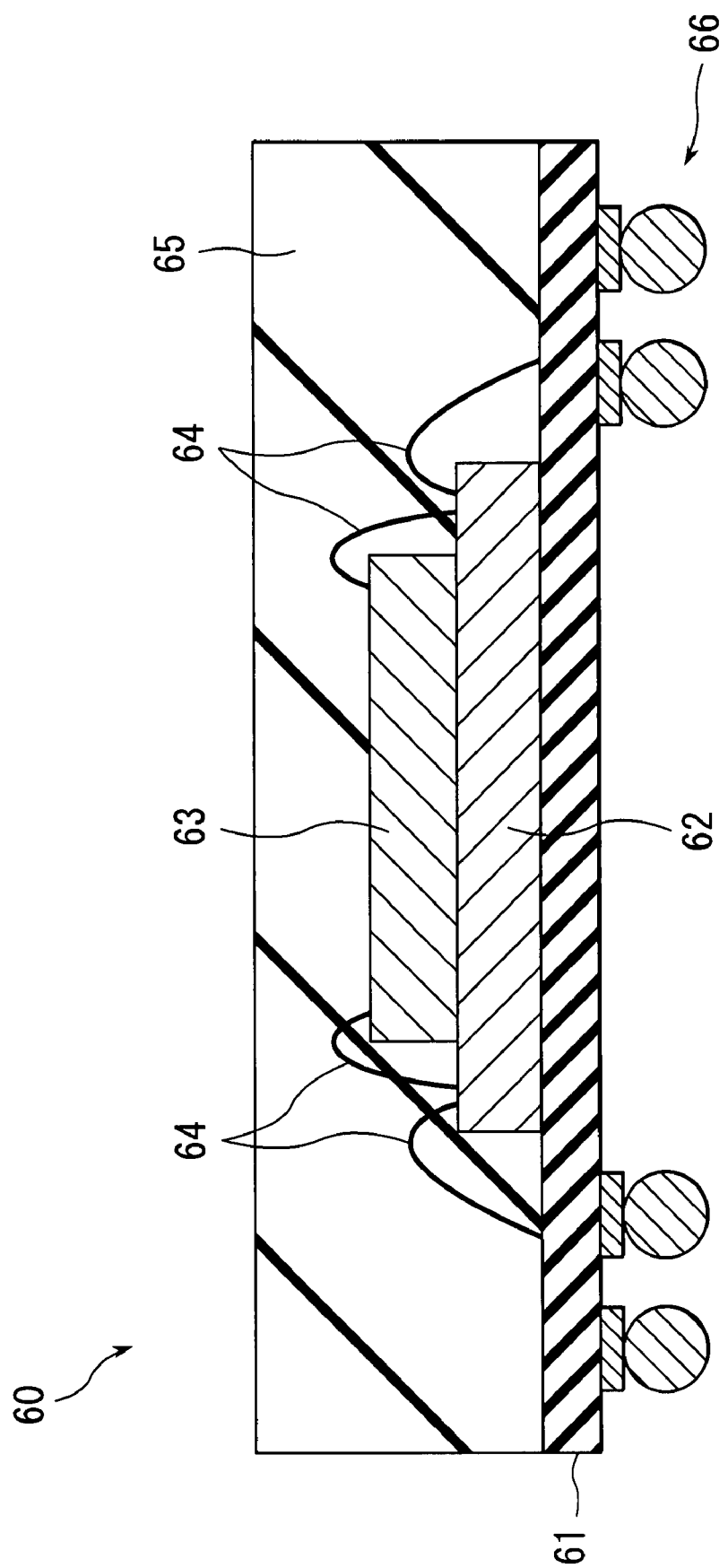
FIG. 4 is a cross-sectional view schematically showing an example of the computer system of FIG. 1.

The above-mentioned computer system 1 of the present embodiment is embodied in a semiconductor package 60 as shown in FIG. 4. The semiconductor package 60 comprises a package substrate 61, a multi-core processor 62, a multi-port memory device 63, wires 64, a seal member 65 and balls 66. The multi-core processor 62 is mounted on the package substrate 61 and comprises multiple, independent processor cores including the first and the second processing units 2, 3 formed in a single chip. The multi-port memory device 63 is stacked and mounted on the multi-core processor 62. Terminals of the package substrate 61, the multi-core processor 62 and the multi-port memory device 63 are suitably coupled by using the wires 64. The multi-core processor 62, the multi-port memory device 63 and the wires 64 are sealed by the sealing member 65. The balls 66 are mounted on the back surface of the package substrate 61 and are connected to the wires 64 by means of via holes (not shown). The computer system 1 may have, instead of the multi-core processor 62, various chips including two or more processors such as an SoC (System On Chip), an ASIC (Application Specific Integrated Circuit) or an FPGA (Field Programmable Gate Array).

Figure 5:
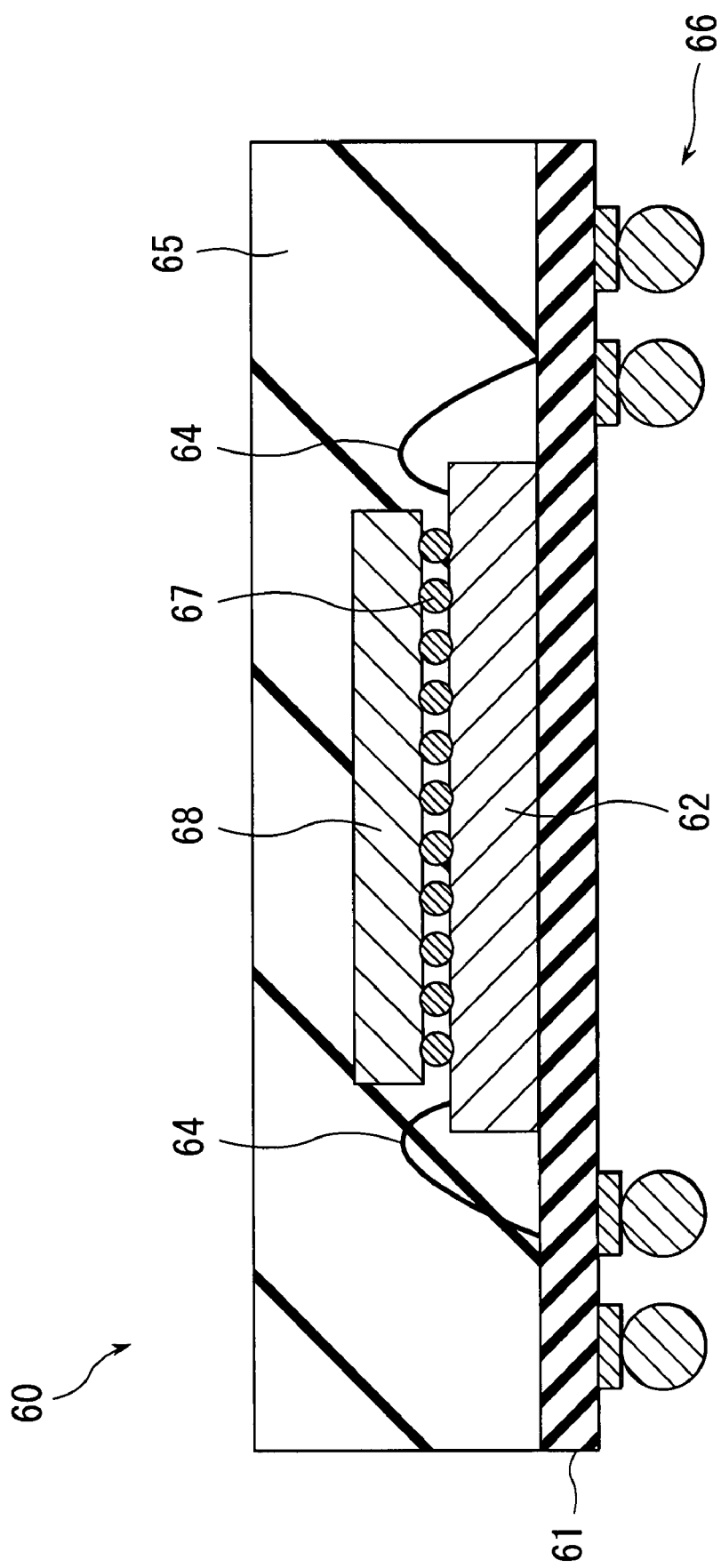
FIG. 5 is a cross-sectional view schematically showing another example of the computer system of FIG. 1.

As shown in FIG. 5, the semiconductor package 60 may comprise a multi-port memory device 68 coupled to the multi-core processor 62 by means of balls 67, instead of the multi-port memory device 63 of FIG. 4.

Figure 6:
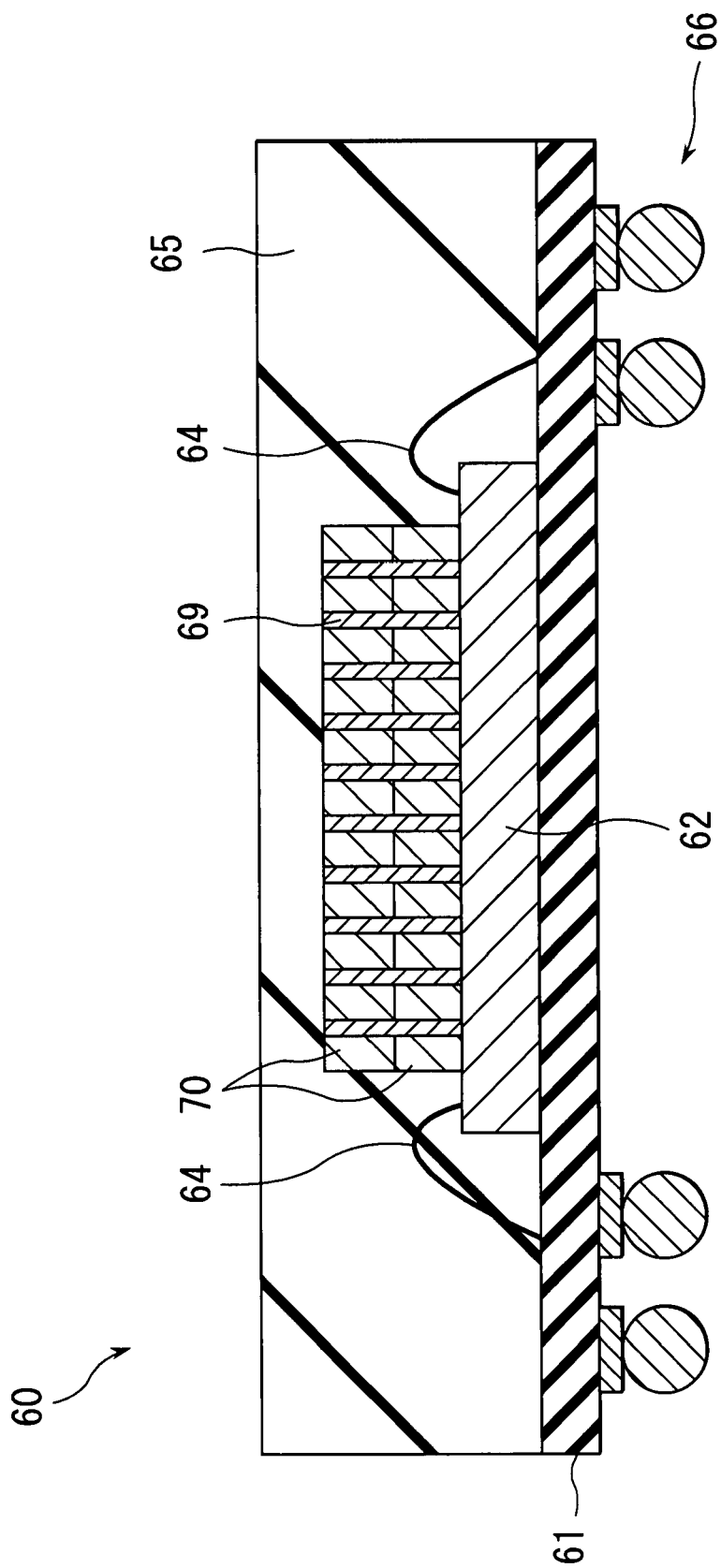
FIG. 6 is a cross-sectional view schematically showing another example of the computer system of FIG. 1.

As shown in FIG. 6, the semiconductor package 60 may comprise a stacked structure comprised of two or more multi-port memory devices 70 coupled to each other by means of Si penetrated electrodes 69, instead of the single multi-port memory device 63 of FIG. 4.

Figure 7:
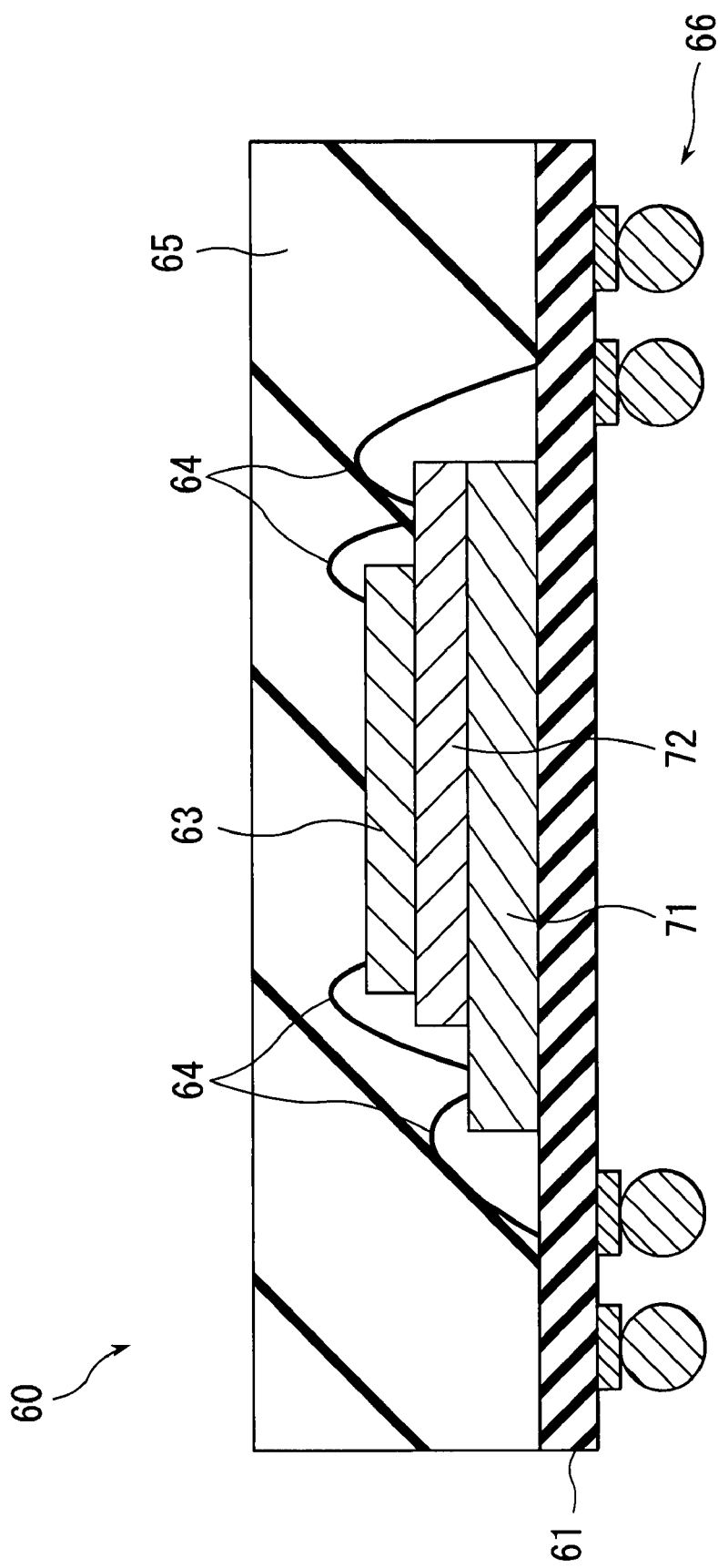
FIG. 7 is a cross-sectional view schematically showing another example of the computer system of FIG. 1.

As shown in FIG. 7, the semiconductor package 60 may comprise a stacked combination of a processor 71 and an ASIC 72, instead of the single multi-core processor 62 of FIG. 4.

Figure 8:
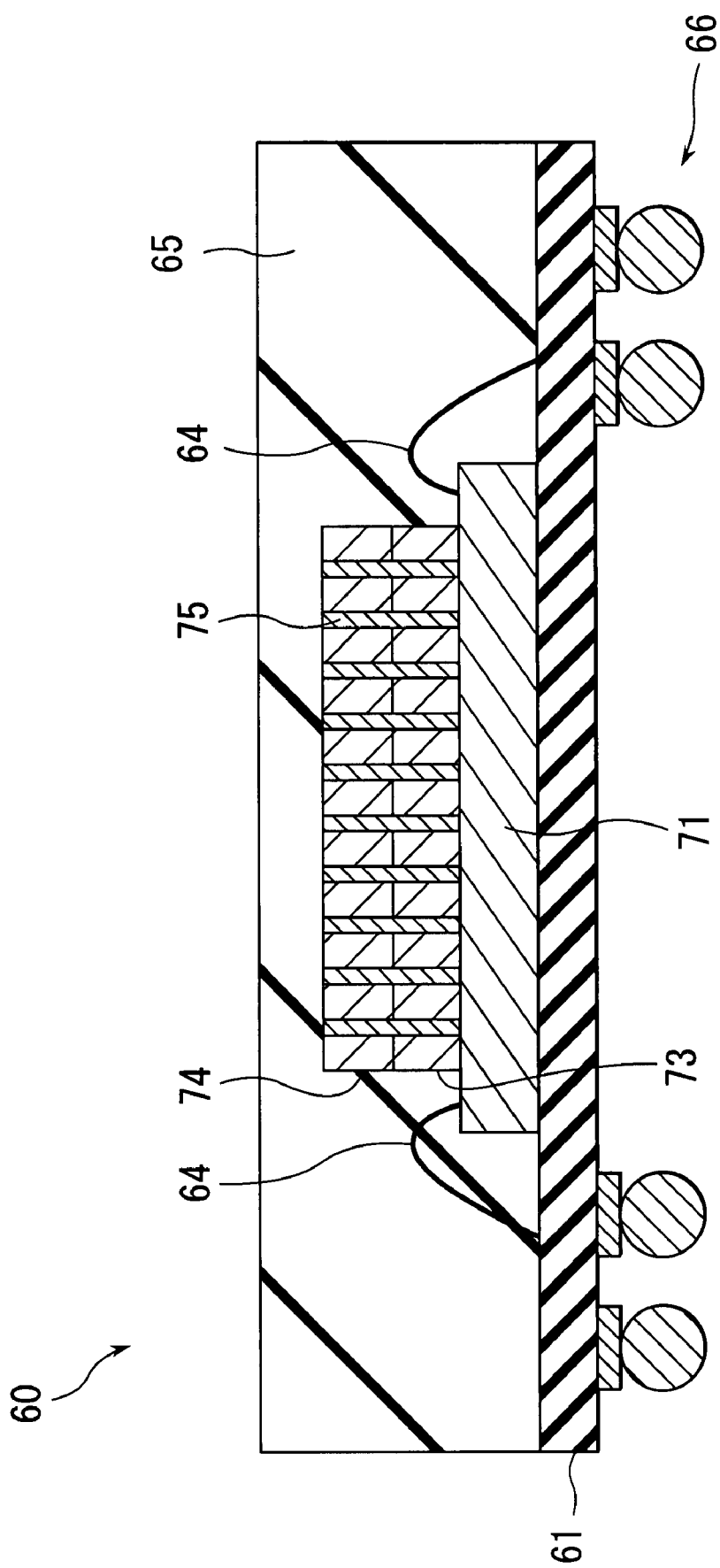
FIG. 8 is a cross-sectional view schematically showing another example of the computer system of FIG. 1.

As shown in FIG. 8, the semiconductor package 60 may comprise a processor 71, an ASIC 73 and a multi-port memory device 74 staked, instead of the single multi-core processor 62 and the single multi-port memory device 63, wherein the ASIC 73 and the multi-port memory device 74 are coupled to each other by means of Si penetrated electrodes 75.

Figure 9:
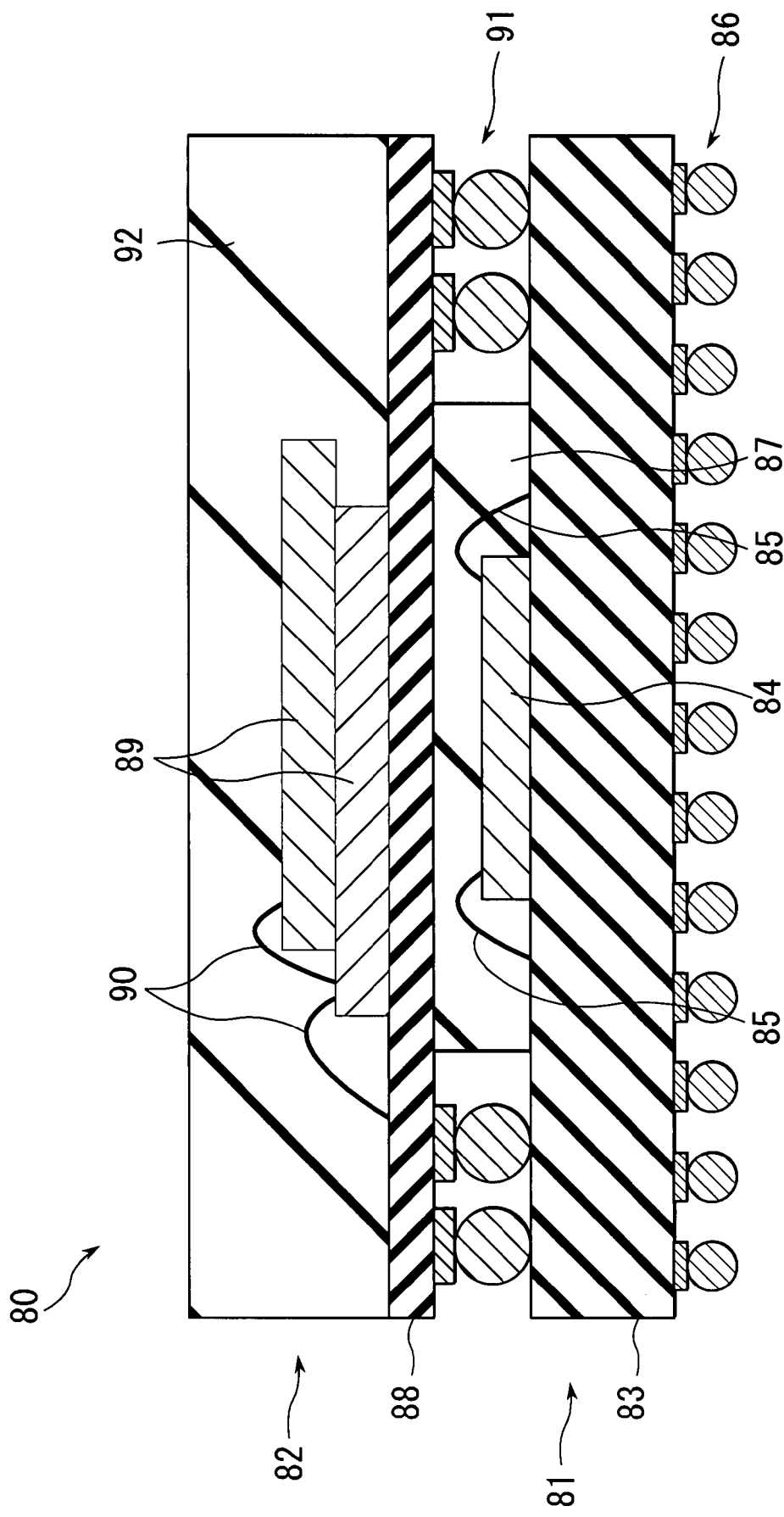
FIG. 9 is a cross-sectional view schematically showing another example of the computer system of FIG. 1.

As shown in FIG. 9, the computer system 1 may comprise a stacked structure 80 of lower and upper packages 81, 82. The lower package 81 comprises a lower substrate 83, a multi-core processor 84, wires 85, balls 86 and a sealing member 87. The multi-core processor 84 is mounted on the lower substrate 83 and is coupled through the wires 85 to patterns formed on the lower substrate 83 so that the multi-core processor 84 is accessible from the outside of the system through the balls 86. The multi-core processor 84 and the wires 85 are sealed by the sealing member 87. The upper package 82 comprises an upper substrate 88, two multi-port memory devices 89, wires 90, balls 91 and a sealing member 92. The multi-port memory devices 89 are stacked on each other, and the stacked combination of the multi-port memory devices 89 is mounted on the upper substrate 88. The multi-port memory devices 89 are coupled through the wires 90 to patterns formed on the upper substrate 88. The multi-port memory devices 89 and the wires 90 are sealed by the sealing member 92. The balls 91 are mounted on the back surface of the upper substrate 88. The balls 91 are also connected to patterns formed on the lower substrate 83, so that the lower and the upper packages 81, 82 are coupled to each other.

The present application is based on Japanese patent applications of JP2006-225773 filed before the Japan Patent Office on Aug. 22, 2006, the contents of which are incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A semiconductor memory device comprising:
   first and second memory groups;
   first and second input/output (I/O) ports;
   a region configurator that sets first and second share regions in the first and second memory groups respectively, the region configurator setting first and second individual regions in the first and second memory groups respectively, the first and second share regions having common addresses to each other, the first and second individual regions having different addresses from each other, the region configurator making the first and second memory groups correspond to the first and second input/output (I/O) ports, respectively;
   a selector that connects each of the first and second memory groups to either one of the first and second input/output (I/O) ports; and
   an access controller that sets the selector to write a set of data, which has been supplied from either one of the first and second input/output (I/O) ports, in both the first and second share regions so that both the first and second share regions store the same set of data,
   wherein the access controller sets the selector to read out the same set of data from the first and second share regions respectively to the first and second input/output (I/O) ports, simultaneously with each other.

2. The semiconductor memory device according to claim 1, wherein the first and second share regions as set by the region configurator are reconfigurable.

3. The semiconductor memory device according to claim 2, wherein the region configurator has configurable connections between the first and second memory groups to the first and second input/output (I/O) ports.

4. The semiconductor memory device according to claim 1, wherein, during a time period of writing a set of data supplied from one of the first and second input/output (I/O) ports into both the first and second share regions, the access controller prohibits any access to the first and second memory groups through the other of the first and second input/output (I/O) ports.

5. The semiconductor memory device according to claim 4, wherein the access controller has an arbitration function that makes it effective to write a set of data supplied through one of the first and second input/output (I/O) ports into the first and second share regions, while it is about to be requested to write from the first and second input/output (I/O) ports.

6. The semiconductor memory device according to claim 5, wherein the access controller allows writing the set of data supplied through the one of the first and second input/output (I/O) ports into the first and second share regions, after there is completed an access through the other of the first and second input/output (I/O) ports to a corresponding one of the first and second memory groups.

7. The semiconductor memory device according to claim 1, wherein the access controller allows writing a set of data supplied from one of the first and second input/output (I/O) ports into a corresponding one of the first and second memory groups during an access from the other of the first and second input/output (I/O) ports to the other corresponding one of the first and second memory groups, and
   the access controller allows writing the set of data into the other of the first and second memory groups after the access has been completed.

8. The semiconductor memory device according to claim 1, wherein the access controller sets the selector to connect the first and second input/output (I/O) ports to the first and second memory groups respectively, when writing sets of data into the first and second individual regions.

9. The semiconductor memory device according to claim 2, wherein the access controller sets the selector to connect the first and second input/output (I/O) ports to the first and second memory groups respectively, when reading sets of data out of the first and second individual regions.

10. The semiconductor memory device according to claim 2, wherein reading a set of data out of the first memory group and writing another set of data into the individual region of the second memory group are performed simultaneously.

11. A semiconductor memory device comprising:
    first and second input/output (I/O) ports;
    first and second memory areas provided respectively for the first and second input/output (I/O) ports, the first memory area including a first share region, and the second memory area including a second share region; and
    a control circuit responding to a write access from one of the first and second input/output (I/O) ports to write data into both of the first and second share regions, the first and second share regions thereby storing the same data as each other, the control circuit further responding to a read access from the first input/output (I/O) port and to a read access from the second input/output (I/O) port to read and supply first data from the first share region to the first input/output (I/O) port and second data from the second share region to the second input/output (I/O) port in parallel to each other.

12. A computer system comprising:

the semiconductor memory device according to claim 11; and
a plurality of processing units configured to be allowed to access the first and second memory areas through the respective first and second input/output (I/O) ports.

* * * * *